United States Patent [19]
Sandman et al.

[11] Patent Number: 6,062,776
[45] Date of Patent: May 16, 2000

[54] COATED CUTTING INSERT AND METHOD OF MAKING IT

[75] Inventors: Annika Sandman, Enskededalen; Camilla Oden, Stockholm; Jeanette Persson, Nacka; Åke Östlund, Hägersten, all of Sweden

[73] Assignee: Sandvik AB, Sandviken, Sweden

[21] Appl. No.: 09/077,370

[22] PCT Filed: Nov. 29, 1996

[86] PCT No.: PCT/SE96/01579

§ 371 Date: Sep. 1, 1998

§ 102(e) Date: Sep. 1, 1998

[87] PCT Pub. No.: WO97/20083

PCT Pub. Date: Jun. 5, 1997

[30] Foreign Application Priority Data

Nov. 30, 1995 [SE] Sweden .................................. 9504304
Oct. 4, 1996 [SE] Sweden .................................. 9603662

[51] Int. Cl.[7] .................................................. B23B 27/14
[52] U.S. Cl. ...................... 407/119; 407/118; 427/255.2; 428/216
[58] Field of Search .................................. 407/119, 118; 427/255.2, 255.3, 255.7, 419.2, 419.7, 126.1; 428/216, 212, 457, 489, 697, 698, 699, 701, 702; 51/309

[56] References Cited

U.S. PATENT DOCUMENTS

| | | |
|---|---|---|
| 4,643,620 | 2/1987 | Fujii et al. . |
| 5,137,774 | 8/1992 | Ruppi . |
| 5,162,147 | 11/1992 | Ruppi . |
| 5,372,873 | 12/1994 | Yoshimura et al. . |
| 5,436,071 | 7/1995 | Odani et al. .............................. 428/336 |
| 5,576,093 | 11/1996 | Yoshimura et al. . |
| 5,652,045 | 7/1997 | Nakamura et al. ..................... 428/216 |
| 5,674,464 | 10/1997 | Ljungberg et al. . |
| 5,770,261 | 6/1998 | Nakamura et al. ..................... 427/255 |
| 5,786,069 | 7/1998 | Ljungberg et al. ................. 407/119 X |
| 5,863,640 | 1/1999 | Ljungberg et al. ................. 407/119 X |
| 5,902,671 | 5/1999 | Kutscher ............................. 407/119 X |
| 5,920,760 | 7/1999 | Yoshimura et al. ..................... 428/551 |

FOREIGN PATENT DOCUMENTS

| | | |
|---|---|---|
| 0686707 | of 1995 | European Pat. Off. . |
| 0653499 | 5/1995 | European Pat. Off. . |
| 0685572 | 12/1995 | European Pat. Off. . |
| 0693574 | 1/1996 | European Pat. Off. . |
| 0709484 | 5/1996 | European Pat. Off. . |

OTHER PUBLICATIONS

Patent Abstracts of Japan, vol. 18, No. 392, C–1228, abstract of JP,A,6–108254 (Mitsubishi Materials Corp), Apr. 19, 1994 & JP,A, 6108254.

Patent Abstracts of Japan, vol. 18, No. 203, M–1590, abstract of JP,A,6–8008 (Mitsubishi Materials Corp), Jan. 18, 1994, & JP,A, 6008008.

*Primary Examiner*—Henry W. H. Tsai
*Attorney, Agent, or Firm*—Burns, Doane, Swecker & Mathis, L.L.P.

[57] ABSTRACT

A coated turning insert particularly useful for dry and wet machining in low and medium alloyed steels, stainless steels, with or without raw surface zones under severe conditions such as vibrations, long overhang and recutting of chips. The insert is characterized by a WC—Co cemented carbide with a low content of cubic carbides and a rather low W-alloyed binder phase and a coating including an innermost layer of $TiC_xN_yO_z$ with columnar grains and a top layer of TiN and an intermediate layer of $\kappa$-$Al_2O_3$. The layers are deposited by using CVD-methods.

16 Claims, No Drawings

COATED CUTTING INSERT AND METHOD OF MAKING IT

BACKGROUND OF THE INVENTION

The present invention relates to a coated cutting tool (cemented carbide insert) particularly useful for toughness demanding wet and dry machining, preferably milling, of low and medium alloyed steels and stainless steels, with raw surfaces such as cast skin, forged skin, hot or cold rolled skin or pre-machined surfaces under unstable conditions.

When machining low and medium alloyed steels and stainless steels with cemented carbide tools, the cutting edge is worn according to different wear mechanisms, such as chemical wear, abrasive wear, adhesive wear and by edge chipping caused by cracks formed along the cutting edge, the so called comb cracks. Under bad conditions, problems with bulk and edge line breakages occur commonly.

Different cutting conditions require different properties of the cutting insert. For example, when cutting in steels with raw surface zones or cutting under difficult conditions, a coated cemented carbide insert must consist of a tough carbide and have very good coating adhesion. When machining in low alloyed steels, and stainless steels the adhesive wear is generally the dominating wear type. Here, generally 1–3 $\mu$m CVD- or PVD-coatings have to be used.

Measures can be taken to improve the cutting performance with respect to a specific wear type. However, very often such action will have a negative effect on other wear properties.

The influence of some possible measures is given below:

1.) Comb crack formation can be reduced by lowering the binder phase content. However, such action will lower the toughness properties of the cutting inserts which is not desirable.

2.) Improved abrasive wear can be obtained by increasing the coating thickness. However, thick coatings increase the risk of flaking and will lower the resistance to adhesive wear.

3.) Machining at high cutting speeds and at high cutting edge temperatures requires a cemented carbide with a rather high amount of cubic carbides (solid solution of WC—TiC—TaC—NbC). Such carbides will more easily develop comb cracks.

4.) Improved toughness can be obtained by increasing the Co-content. However, high Co-content will decrease the plastic deformation resistance.

So far it has been very difficult to improve all tool properties simultaneously. Commercial cemented carbide grades have therefore been optimized with respect to one or few of these wear types and hence to specific application areas.

Swedish patent application 9504304-8 which corresponds to U.S. Ser. No. 09/077,360 filed concurrently herewith (Attorney Docket No. 02444-499), discloses a coated cutting insert particularly useful for milling in low and medium alloyed steel with or without raw surface zones during wet or dry conditions. The insert is characterized by WC—Co cemented carbide with a low content of cubic carbides and a highly W-alloyed binder phase and a coating including an innermost layer of $TiC_xN_yO_z$ with columnar grains and a top layer of TiN and an inner layer of $\kappa$-$Al_2O_3$.

Swedish patent application 9501286-0 which corresponds to U.S. Ser. No. 08/616,012, herein incorporated by reference; discloses a coated cutting insert particularly useful for dry milling of grey cast iron. The insert is characterized by a straight WC—Co cemented carbide grade and a coating including a layer of $TiC_xN_yO_z$ with columnar grains and a top layer of fine grained textured $\alpha$-$Al_2O_3$.

Swedish patent application 9502640-7 which corresponds to U.S. Ser. No. 08/675,034, herein incorporated by reference, discloses a coated turning insert particularly useful for intermittent turning in low alloyed steel. The insert is characterized by a WC—Co cemented carbide body having a highly W-alloyed Co-binder phase and a coating including a layer of $TiC_xN_yO_z$ with columnar grains and a top layer of a fine grained, textured $\alpha$-$Al_2O_3$.

Swedish patent application 9503056-5 which corresponds to U.S. Ser. No. 08/703,965, herein incorporated by reference, discloses a coated turning cutting tool particularly useful for cutting in hot and cold forged low alloyed steel. The insert is characterized by a WC—Co cemented carbide body having a highly W-alloyed Co-binder phase and a coating including a layer of $TiC_xN_yO_z$ with columnar grains and a top layer of a fine-grained, $\alpha$-$Al_2O_3$.

Swedish patent application 9602413-8 which corresponds to U.S. Ser. No. 09/077,424 filed concurrently herewith (Attorney Docket No. 024444-497); discloses a coated turning insert particularly useful for turning in stainless steel. The insert is characterised by WC—Co-based cemented carbide substrate having a highly W-alloyed Co-binder phase and a coating including an innermost layer of $TiC_xN_yO_z$ with columnar grains and a top layer of TiN and an inner layer of fine grained $\kappa$-$Al_2O_3$.

OBJECTS AND SUMMARY OF THE INVENTION

It is an object of this invention to avoid or alleviate the problems of the prior art.

It is further an object of this invention to provide a coated cutting tool particularly useful toughness-demanding wet and dry machining.

In one aspect of the invention there is provided a cutting tool insert particularly useful for wet or dry machining of low and medium alloyed steels, stainless steels, with or without raw surfaces, comprising a cemented carbide body and a coating wherein said cemented carbide body contains WC with an average grain size of 1.5–2.5 $\mu$m, 10.9–13 wt-% Co and 0.2–1.8 wt-% TaC+NbC, and a low W-alloyed binder phase with a CW-ratio of 0.87–0.99 and said coating is a first (innermost) layer of $TiC_xN_yO_z$ with x+y+z=1, with a thickness of 0.1–1.5 $\mu$m, and with equiaxed grains with size <0.5 $\mu$m a second layer of $TiC_xN_yO_z$ with x+y+z=1, with a thickness of 1–8 $\mu$m with columnar grains with diameter of <5 $\mu$m and a layer of a smooth, fine-grained (0.5–2 $\mu$m) $\kappa$-$Al_2O_3$ with a thickness of 0.5–5 $\mu$m.

In another aspect of the invention, there is provided a method of making a cutting insert comprising a cemented carbide body and a coating, the WC—Co-based cemented carbide body contains WC with an average grain size of 1.5–2.5 $\mu$m, 10.9–13 wt-% Co and 0.4–1.8 wt-% TaC+NbC, and a low W-alloyed binder phase with a CW-ratio of 0.87–0.99 comprising coating the said body with a first (innermost) layer of $TiC_xN_yO_z$ with x+y+z=1, with a thickness of 0.1–1.5 $\mu$m, with equiaxed grains with size <0.5 $\mu$m using known CVD-methods a second layer of $TiC_xN_yO_z$ with x+y+z=1, with a thickness of 1–8 $\mu$m with columnar grains with a diameter of about <5 $\mu$m deposited by MTCVD-technique, using acetonitrile as the carbon and nitrogen source for forming the layer in a preferred temperature range of 850–900° C. and a layer of a smooth κ-$Al_2O_3$ with a thickness of 0.5–5 μm using known CVD-methods.

DETAILED DESCRIPTION OF THE PREFERRED EMBODIMENTS OF THE INVENTION

It has now surprisingly been found that by combining many different features a cutting tool, preferably for milling, can be obtained with excellent cutting performance in low and medium alloyed steel, with or without raw surface zones preferably under unstable conditions such as vibrations, long overhang, chip-hammering or recutting of chips or in generally toughness demanding operations both under wet and dry conditions. It has also been found that this specific cutting tool also works in stainless steel. The cutting tool according to the invention shows improved properties with respect to many of the wear types earlier mentioned.

The cutting tool insert according to the invention is of: a cemented carbide body with a rather low W-alloyed binder phase and with a well balanced chemical composition and grain size of the WC, a columnar $TiC_xN_yO_z$-layer, a κ-$Al_2O_3$-layer, a TiN-layer and optionally followed by smoothening the cutting edges by brushing the edges with, e.g., a SiC based brush.

According to the present invention, a coated cutting tool insert is provided of a cemented carbide body with a composition of 10.9–13 wt % Co, preferably 11.0–12.0 wt % Co, most preferably 11.1–11.7 wt % Co, 0.2–1.8 wt % cubic carbides, preferably 0.4–1.8 wt % cubic carbides, most preferably 0.5–1.7 wt % cubic carbides of the metals Ta, Nb and Ti and balance WC. The cemented carbide may also contain other carbides from elements from group IVb, Vb or VIb of the periodic table. The content of Ti is preferably on a level corresponding to a technical impurity. The average grain size of the WC is in the range of about 1.5–2.5 μm, preferably about 1.7 μm.

The cobalt binder phase is rather low alloyed with W. The content of W in the binder phase can be expressed as the CW-ratio=$M_s$/(wt % Co·0.0161), where $M_s$ is the measured saturation magnetization of the cemented carbide body in kA/m and wt % Co is the weight percentage of Co in the cemented carbide. The CW-value is a function of the W content in the Co binder phase. A high CW-value corresponds to a low W-content in the binder phase.

It has now been found according to the present invention that improved cutting performance is achieved if the cemented carbide body has a CW-ratio of 0.87–0.99, preferably 0.88–0.97, and most preferably 0.90–0.95. The cemented carbide may contain small amounts, <1 volume %, of η-phase ($M_6C$), without any detrimental effect. From the CW-value it follows that no free graphite is allowed in the cemented carbide body according to the present invention.

The coating comprises a first (innermost) layer of $TiC_xN_yO_z$ with x+y+z=1, preferably y>x and z<0.2, most preferably y>0.8 and z=0, with equiaxed grains with size <0.5 μm and a total thickness <1.5 μm preferably >0.1 μm.

a layer of $TiC_xN_yO_z$ with x+y+z=1, μm preferably with z=0, x>0.3 and y>0.3, most preferably x>0.5, with a thickness of 1–8 μm, preferably 2–7 μm, most preferably <6 μm, with columnar grains and with an average diameter of <5 μm, preferably 0.1–2 μm a layer of a smooth, fine-grained (grain size about 0.5–2 μm) $Al_2O_3$ consisting essentially of the κ-phase. However, the layer may contain small amounts, 1–3 vol-%, of the θ- or the α-phases as determined by XRD-measurement. The $Al_2O_3$-layer has a thickness of 0.5–5 μm, preferably 0.5–2 μm, and most preferably 0.5–1.5 μm. Preferably, this $Al_2O_3$-layer is followed by a further layer (<1 μm, preferably 0.1–0.5 μm thick) of $TiC_xN_yO_z$ with x+y+z=1, preferably with y>x and z<0.3, most preferable y>0.8, but the $Al_2O_3$ layer can be the outermost layer. This outermost layer, $Al_2O_3$ or $TiC_xN_yO_z$, has a surface roughness $R_{max} \leq 0.4$ μm over a length of 10 μm. The $TiC_xN_yO_z$-layer, if present, is preferably removed along the cutting edge. Alternatively, the $TiC_xN_yO_z$ layer is removed and the underlying alumina layer is partly or completely removed along the cutting edge.

The present invention also relates to a method of making a coated cutting tool insert of a cemented carbide body with a composition of 10.9–13 wt % Co, preferably 11.0–12.0 wt % Co, most preferably 11.1–11.7 wt % Co, 0.2–1.8 wt % cubic carbides, preferably 0.4–1.8 wt % cubic carbides, most preferably 0.5–1.7 wt % cubic carbides of the metals Ta, Nb and Ti and balance WC. The cemented carbide may also contain other carbides from elements from group IVb, Vb or VIb of the periodic table. The content of Ti is preferably on a level corresponding to a technical impurity. The average grain size of the WC is in the range of about 1.5–2.5 μm, preferably about 1.7 μm. Onto the cemented carbide body is deposited a first (innermost) layer of $TiC_xN_yO_z$ with x+y+z=1, preferably y>x and z<0.2, most preferably y>0.8 and z=0, with equiaxed grains with size <0.5 μm and a total thickness <1.5 μm, preferably >0.1 μm, using known CVD-methods.

a layer of $TiC_xN_yO_z$ with x+y+z=1, preferably with z=0, x>0.3 and y>0.3, most preferably x>0.5, with a thickness of 1–8 μm, preferably 2–7 μm, most preferably <6 μm, with columnar grains and with an average diameter of about <5 μm, preferably 0.1–2 μm, using preferably MTCVD-technique (using acetonitrile as the carbon and nitrogen source for forming the layer in the temperature range of 700–900° C.). The exact conditions, however, depend to a certain extent on the design of the equipment used.

a smooth $Al_2O_3$-layer essentially consisting of κ-$Al_2O_3$ is deposited under conditions disclosed in, e.g., EP-A-523 021 which corresponds to U.S. Pat. No. 5,674,564, herein incorporated by reference. The $Al_2O_3$ layer has a thickness of 0.5–5 μm, preferably 0.5–2 μm, and most preferably 0.5–1.5 μm. Preferably, a further layer (<1 μm, preferably 0.1–0.5 μm thick) of $TiC_xN_yO_z$ is deposited, but the $Al_2O_3$-layer can be the outermost layer. This outermost layer, $Al_2O_3$ or $TiC_xN_yO_z$, has a surface roughness $R_{max} \leq 0.4$ μm over a length of 10 μm. The smooth coating surface can be obtained by a gentle wet-blasting of the coating surface with fine-grained (400–150 mesh) alumina powder or by brushing (preferably used when $TiC_xN_yO_z$ top coating is present) the edges with brushes based on, e.g., SiC as disclosed, e.g., in Swedish patent application 9402543-4 which corresponds to U.S. Ser. No. 08/497, 937, herein incorporated by reference. The $TiC_xN_yO_z$-layer, if present, is preferably removed along the cutting edge. Alternatively, the $TiC_xN_yO_z$ layer is removed and the underlying alumina layer is partly or completely removed along the cutting edge.

The invention is additionally illustrated in connection with the following Examples which are to be considered as illustrative of the present invention. It should be understood, however, that the invention is not limited to the specific details of the Examples.

EXAMPLE 1

A. A cemented carbide milling tool in accordance with the invention with the composition 11.5 wt-% Co, 1.25 wt-% TaC, 0.30 wt-% NbC and balance WC, with a binder phase alloyed with W corresponding to a CW-ratio of 0.93 were coated with a 0.5 $\mu$m equiaxed TiC$_{0.05}$N$_{0.95}$-layer (with a high nitrogen content corresponding to an estimated C/N-ratio of 0.05) followed by a 4 $\mu$m thick TiC$_{54}$N$_{0.46}$-layer, with columnar grains by using MTCVD-technique (temperature 885–850° C. and CH$_3$CN as the carbon/nitrogen source). In subsequent steps during the same coating cycle, a 1.0 $\mu$m thick layer of Al$_2$O$_3$ was deposited using a temperature 970° C. and a concentration of H$_2$S dopant of 0.4% as disclosed in EP-A-523 021 which corresponds to U.S. Pat. No. 5,674,564. A thin (0.3 $\mu$m) layer of TiN was deposited on top according to known CVD-technique. XRD-measurement showed that the Al$_2$O$_3$-layer consisted of 100% κ-phase. The cemented carbide body had a WC grain size in average of 1.7 $\mu$m. The coated inserts were brushed by a nylon straw brush containing SiC grains. Examination of the brushed inserts in a light microscope showed that the thin TiN-layer and some of the Al$_2$O$_3$-layer had been brushed away only along the cutting edge leaving there a smooth Al$_2$O$_3$-surface. Coating thickness measurements on cross-section brushed samples showed that the outer TiN-layer and roughly half of the Al$_2$O$_3$-layer was removed along the edge line.

B. A cemented carbide milling tool in accordance with the invention with the composition 11.1 wt-% Co, 1.25 wt-% TaC, 0.30 wt-% NbC and balance WC, with a binder phase alloyed with W corresponding to a CW-ratio of 0.93 were coated with a 0.5 $\mu$m equiaxed TiC$_{0.05}$N$_{0.95}$-layer followed by a 4 $\mu$m thick TiC$_{0.54}$N$_{0.46}$-layer, with columnar grains by using MTCVD-technique (temperature 885–850° C. and CH$_3$CN as the carbon/nitrogen source). In subsequent steps during the same coating cycle, a 1.0 $\mu$m thick layer of Al$_2$O$_3$ was deposited using a temperature 970° C. and a concentration of H$_2$S dopant of 0.4% as disclosed in EP-A-523 021 which corresponds to U.S. Pat. No. 5,674,564. A thin (0.3 $\mu$m) layer of TiN was deposited on top according to known CVD-technique. XRD-measurement showed that the Al$_2$O$_3$-layer consisted of 100% κ-phase. The cemented carbide body had a WC grain size in average of 1.8 $\mu$m. The coated inserts were brushed by a nylon straw brush containing SiC grains. Examination of the brushed inserts in a light microscope showed that the thin TiN-layer and some of the Al$_2$O$_3$-layer had been brushed away only along the cutting edge leaving there a smooth Al$_2$O$_3$-surface. Coating thickness measurements on cross sectioned brushed samples showed that the outer TiN-layer and roughly half of the Al$_2$O$_3$-layer was removed along the edge line.

C. A strongly competitive cemented carbide grade from an external leading carbide producer was selected for comparison in a milling test. The carbide had a composition of 11.4 wt-% Co, 0.1 wt-% TiC, 1.9 wt-% TaC, 0.4 wt % NbC balance WC and a CW-ratio of 0.90. The WC-grain size was 1.4 $\mu$m. The insert had a PVD-coating consisting of total 5 $\mu$m of TiN/TiC/Ti(C,N)/TiC layers.

D. A strongly competitive cemented carbide grade from an external leading carbide producer was selected for comparison in a milling test. The carbide had a composition of 11.5 wt-% Co, 0.2 wt-% TiC, 1.4 wt-% TaC, balance WC and a CW-ratio of 0.97. The WC-grain size was 1.5 $\mu$m. The insert had a conventional CVD-coating consisting of total 4.8 $\mu$m of TiN/Ti(C,N)/TiC layers.

| Operation: | Face milling-roughing, cutter diameter. 160 mm |
|---|---|
| Work-piece: | Connecting rod for ship |
| Material: | 6S42CrMo4V-cast skin, 260 HB |
| Cutting speed: | 151 m/min |
| Feed rate/tooth: | 0.15 mm/rev. |
| Depth of cut: | 2–3 mm |
| Insert-style: | TPKN 2204 PDR |
| Note: | 10 inserts, dry, overhang, some vibrations |

| Results: | Tool-life, min: |
|---|---|
| Grade A: | 26 |
| Grade B: | 39 |
| Competitor C (prior art): | 1.3 |
| Competitor D (prior art): | 13 |

Tool-life criteria were chipping of the edge line and breakages.

EXAMPLE 2

E. A cemented cutting tool with the composition of 8.0 wt-% Co, 0.1 wt-% TiC, balance WC and CW-ratio of 0.88. The WC-grain size was 3.2 $\mu$m. The insert had a conventional CVD-coating consisting of total 2.5 $\mu$m TiC/Ti(C,N)/TiN.

Inserts from A, B, C and E were tested in a face milling operation.

| Operation: | Face milling, R260.22-250 |
|---|---|
| Work-piece: | Bar, 200 × 250 mm with holes |
| Material: | SS2541 |
| Cutting speed: | 100 m/min |
| Feed rate/tooth: | 0.4 mm/rev. |
| Depth of cut: | 2 mm |
| Insert-style: | SEKN 1204 |
| Note: | offset 20 mm, single tooth, dry, different exit angles due to the holes, some vibrations |

| Results: | Tool-life, min |
|---|---|
| Grade A: | 132 |
| Grade B: | 19 |
| Competitor C (prior art): | 13 |
| Competitor E (prior art): | 7 |

Tool-life criteria were edge-line chipping and bulk breakages.

EXAMPLE 3

F. A cemented cutting tool identical to the one mentioned in insert A except that the coating was not brushed.

G. A cemented cutting tool identical to the one mentioned in insert B except that the coating is brushed differently. Examination of the brushed inserts in a light microscope showed that the thin TiN-layer had been brushed away only along the cutting edge leaving there a smooth Al$_2$O$_3$-layer surface. Coating thickness measurements on cross-sectioned brushed samples showed no reduction of the coating along the edge line except for the outer TiN-layer that was removed.

H. A strongly competitive cemented (carbide grade from an external leading carbide producer was selected for comparison in a milling test. The carbide had a composition of 9.5 wt-% Co, 6.6 wt-% TiC, 12.7 wt-% TaC, 1.4 wt-% NbC, balance WC and a CW-ratio of 0.83. The insert was uncoated.

Inserts from A, B and F were tested in a face milling operation.

| Operation: | Face milling-roughing, R282.2-200-30 |
| --- | --- |
| Work-piece: | Plate, 800 × 4200 mm |
| Material: | Fe, forging skin, sand inclusions, 150–250 HB |
| Cutting speed: | 100 m/min |
| Feed rate/tooth: | 0.19 mm/rev. |
| Depth of cut: | 6–8 mm |
| Insert-style: | TPKN 2204 PDR |
| Note: | dry, 11 teeth, heavy vibrations |
| Results: | Tool-life, min: |
| Grade F: | 26 |
| Grade G: | 26 |
| Competitor H (prior art): | 7 |

Tool-life criterion was chipping of the edge.

EXAMPLE 4

I. A cemented cutting tool with the (composition of 9.1 wt-% Co, 1.2 wt-% TaC, 0.3 wt-% NbC, balance WC and CW-ratio of 0.89. The WC-grain size was 1.7 $\mu$m. The insert had the same coating as mentioned in example A.

Inserts from A, B, E and G were tested in a square-shoulder test.

| Operation: | Full slot, widening, 0 exit angle, R290.90-063Q22-12M |
| --- | --- |
| Work-piece: | Bar, 200 × 600 mm |
| Material: | SS1672, rusty surface, 150 HB |
| Cutting speed: | 181 m/min |
| Feed rate/tooth: | 0.17 mm/rev. |
| Depth of cut: | 3–5 mm |
| Insert-style: | R290.90-12T308PPM-WM |
| Note: | dry, 5 teeth, recutting of chips |
| Results: | Tool-life, min: |
| Grade A: | 63 |
| Grade B: | 46 |
| Competitor E (prior art): | 25 |
| Competitor I (prior art): | 5 |

Tool-life criterion was chipping in the edge line due to plastic deformation.

EXAMPLE 5

J. A cemented cutting tool identical to the one mentioned in insert A, but the brushing was different. Examination of the brushed inserts in a light microscope showed that the thin TiN-layer and the $Al_2O_3$-layer had been brushed away only along the cutting edge leaving there a smooth $TiC_{0.54}N_{0.46}$-surface. Costing thickness measurements on cross sectioned brushed samples showed no reduction of the $TiC_{0.54}N_{0.46}$-layer, but the outer TiN-layer and the $Al_2O_3$-layer were remolded along the edge line.

Inserts from C, D, E, I and J were tested in a face milling operation. Two parallel bars each of a thickness of 35 mm were central positioned relatively the cutter body, and the bars were placed with an airgap of 10 mm in between.

| Operation: | Face milling, |
| --- | --- |
| Work-piece: | 2 bars, 35 × 600 mm |
| Material: | SS1672, rusty surface, 150 HB |
| Cutting speed: | 230 m/min |
| Feed rate/tooth: | 0.28 mm/rev. |
| Depth of cut: | 3 mm |
| Insert-style: | SPKN 1203 EDR |
| Note: | wet, one tooth |
| Results: | Tool-life, min: |
| Grade J: | 27 |
| Competitor C (prior art): | 18 |
| Competitor D (prior art): | 22 |
| Competitor E (prior art): | 15 |
| Competitor I (prior art): | 22 |

Tool-life criterion was chipping due to comb crack formation.

EXAMPLE 6

| Operation: | Facing |
| --- | --- |
| Work-piece: | Cylinder, 180 mm |
| Material: | SS2541, 300 HB |
| Cutting speed: | 220 m/min |
| Feed rate: | 0.3 mm/rev. |
| Depth of cut: | 2 mm |
| Insert-style: | CNMG 120408-PM |
| Note: | dry |
| Results: | Tool-life, min: |
| Grade A: | 5 |
| Competitor E (prior art): | 4 |

Tool-life criterion was plastic deformation.

EXAMPLE 7

Inserts from A and E were tested in a turning operation in stainless steel.

| Operation: | Facing and longitudinal turning |
| --- | --- |
| Work-piece: | Cylinder, 96 mm |
| Material: | Sanmac 304L |
| Cutting speed: | 200 m/min |
| Feed rate: | 0.3 mm/rev. |
| Depth of cut: | 2 mm |
| Insert-style: | CNMG 120408-PM |
| Note: | wet |
| Results: | Tool-life, min: |
| Grade A: | 4 |
| Competitor E (prior art): | 3 |

Tool-life criterion was flank wear due to plastic deformation.

EXAMPLE 8

Inserts from A and E were tested in a turning operation in low alloyed steel.

| Operation: | Facing, edge-line flaking test |
|---|---|
| Work-piece: | Pre-machined cylinder, 150 mm |
| Material: | SS 2172 |
| Cutting speed: | 130 m/min |
| Feed rate: | 0.2 mm/rev. |
| Depth of cut: | 2 mm |
| Insert-style: | CNMG 120408-PM |
| Note: | dry, five inserts per variant were tested |
| Results: | Edge-line flaking, % |
| Grade A: | 5 |
| Competitor E (prior art): | 21 |

The result is given as a mean-value after one cut. Five inserts per variant were tested.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A cutting tool insert having a cutting edge comprising a cemented carbide body and a coating wherein said cemented carbide body contains WC with an average grain size of 1.5–2.5 $\mu$m, 10.9–13 wt-% Co and 0.2–1.8 wt-% TaC+NbC, and a low W-alloyed binder phase with a CW-ratio of 0.87–0.99 and said coating is a first layer of $TiC_xN_yO_z$ with x+y+z=1, with a thickness of 0.1–1.5 $\mu$m, and with equiaxed grains with size <0.5 $\mu$m a second layer of $TiC_xN_yO_z$ with x+y+z=1, with a thickness of 1–8 $\mu$m with columnar grains with diameter of <5 $\mu$m and a layer of a smooth, fine-grained $\kappa$-$Al_2O_3$ with a thickness of 0.5–5 $\mu$m.

2. The cutting tool insert of claim 1 wherein the cemented carbide has the composition of 11.1–11.7 wt-% Co and 0.5–1.7 wt-% TaC+NbC.

3. The cutting tool insert of claim 1 wherein the CW-ratio is from 0.90–0.95.

4. The cutting tool insert of claim 1 further comprising an outermost $TiC_xN_yO_z$-layer which has been removed from the insert along the cutting edge.

5. The cutting tool insert of claim 1 wherein the $\kappa$-$Al_2O_3$-layer has been removed from the insert along the cutting edge.

6. A method of making a cutting insert comprising a cemented carbide body and a coating, the cemented carbide body containing WC with an average grain size of 1.5–2.5 $\mu$m, 10.9–13 wt-% Co and 0.4–1.8 wt-% TaC+NbC, and a low W-alloyed binder phase with a CW-ratio of 0.87–0.99 comprising coating the said body with a first layer of $TiC_xN_yO_z$ with x+y+z=1, with a thickness of 0.1–1.5 $\mu$m, with equiaxed grains with size <0.5 $\mu$m using CVD a second layer of $TiC_xN_yO_z$ with x+y+z=1, with a thickness of 1–8 $\mu$m with columnar grains with a diameter of about <5 $\mu$m deposited by MTCVD-technique, using acetonitrile as the carbon and nitrogen source for forming the layer in a preferred temperature range of 850–900° C. and a layer of a smooth $\kappa$-$Al_2O_3$ with a thickness of 0.5–5 $\mu$m using CVD.

7. The method of claim 6 wherein said cemented carbide body has the composition 11.1–11.7 wt-% Co and 0.5–1.7 wt-% TaC+NbC.

8. The method of claim 6 wherein the CW-ratio is from 0.90–0.95.

9. The method of claim 6 further comprising an outermost $TiC_xN_yO_z$ layer which is removed along the cutting edge.

10. The method of claim 6 wherein the $\kappa$-$Al_2O_3$-layer is removed along the cutting edge.

11. The cutting tool insert of claim 1 wherein said cemented carbide body has an average grain size of about 1.7 $\mu$m and contains 11–12 wt-% Co.

12. The cutting tool insert of claim 1 wherein in the first (innermost) layer of $TiC_xN_yO_z$, y>x and z<0.2 and in the second layer of $TiC_xN_yO_z$, z=0, x>0.3 and y>0.3.

13. The cutting tool insert of claim 1 wherein the insert contains an outermost layer of TiN with a thickness of <1 $\mu$m.

14. The method of claim 6 wherein the cemented carbide body has an average grain size of about 1.7 $\mu$m and contains 11–12 wt-% Co.

15. The method of claim 6 wherein in the first layer of $TiC_xN_yO_z$, y>x and z<0.2 and in the second layer of $TiC_xN_yO_z$, z=0, x>0.3 and y>0.3.

16. The method of claim 6 wherein the insert contains an outermost layer of TiN with a thickness of <1 $\mu$m.

* * * * *